United States Patent
Terasaki et al.

(10) Patent No.: US 7,422,981 B2
(45) Date of Patent: Sep. 9, 2008

(54) METHOD FOR MANUFACTURING SEMICONDUCTOR DEVICE BY USING DUAL DAMASCENE PROCESS AND METHOD FOR MANUFACTURING ARTICLE HAVING COMMUNICATING HOLE

(75) Inventors: Atsunori Terasaki, Kawasaki (JP); Junichi Seki, Yokohama (JP); Ichiro Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/606,874

(22) Filed: Dec. 1, 2006

(65) Prior Publication Data
US 2007/0128850 A1    Jun. 7, 2007

(30) Foreign Application Priority Data
Dec. 7, 2005  (JP) ............................. 2005-353752
Oct. 11, 2006  (JP) ............................. 2006-277726

(51) Int. Cl.
*H01L 21/44* (2006.01)
(52) U.S. Cl. .............................. 438/687; 257/E21.579
(58) Field of Classification Search ................ 438/687; 257/E21.579
See application file for complete search history.

(56) References Cited

U.S. PATENT DOCUMENTS

| 5,882,999 | A | 3/1999 | Anderson et al. ............ 438/629 |
| 6,334,960 | B1 | 1/2002 | Willson et al. ................ 216/52 |
| 6,376,366 | B1 | 4/2002 | Lin et al. ..................... 438/637 |
| 6,548,900 | B1 | 4/2003 | Kusumi ........................ 257/758 |
| 6,627,540 | B2 | 9/2003 | Lee ............................. 438/638 |
| 6,830,503 | B1 * | 12/2004 | Grumbine ..................... 451/41 |
| 7,071,088 | B2 | 7/2006 | Watts et al. .................. 438/612 |
| 7,157,366 | B2 | 1/2007 | Kim et al. .................... 438/622 |
| 2004/0224261 | A1 | 11/2004 | Resnick et al. ............... 430/311 |

(Continued)

FOREIGN PATENT DOCUMENTS

EP    0 905 768    3/1999

(Continued)

OTHER PUBLICATIONS

Michael D. Stewart, et al., "Direct Imprinting of Dielectric Materials for Dual Damascene Processing", Proceedings of SPIE, vol. 5751, May 2005, pp. 210-218.

(Continued)

*Primary Examiner*—Trung Dang
(74) *Attorney, Agent, or Firm*—Fitzpatrick, Cella, Harper & Scinto.

(57) ABSTRACT

A method for manufacturing a semiconductor device is provided, in which the lengths of a wiring trench and a via hole in a depth direction are easily controlled. A component having a first insulating film is prepared on a substrate, and a layer is disposed on the above-described first insulating film. A mold having a pattern is imprinted on the above-described layer so as to form a second insulating film having a wiring trench and a first via, the pattern corresponding to the wiring trench and the first via. Thereafter, the above-described first insulating film is etched by using the above-described second insulating film as a mask so as to form a second via, which is connected to the first via, in the first insulating film.

12 Claims, 7 Drawing Sheets

U.S. PATENT DOCUMENTS

2005/0202350 A1* 9/2005 Colburn et al. .............. 430/320
2006/0213868 A1* 9/2006 Siddiqui et al. ............... 216/88

FOREIGN PATENT DOCUMENTS

| JP | 11-224880 | 8/1999 |
| JP | 11-330235 | 11/1999 |
| JP | 2004-221191 | 8/2004 |
| WO | 02/078082 | 10/2002 |
| WO | 2005/031855 | 4/2005 |

OTHER PUBLICATIONS

Stephen Y. Chou, et al., "Imprint of sub-25 nm vias and trenches in polymers", Applied Physics Letters, vol. 67, No. 21, 1995, pp. 3114-3116.

Michael D. Stewart, et al., "Direct Imprinting of Dielectric Materials for Dual Damascene Processing", SPIE Microlithography Conference, Mar. 2005.

* cited by examiner

METHOD FOR MANUFACTURING SEMICONDUCTOR DEVICE BY USING DUAL DAMASCENE PROCESS AND METHOD FOR MANUFACTURING ARTICLE HAVING COMMUNICATING HOLE

BACKGROUND OF THE INVENTION

1. Field of the Invention

The present invention relates to a method for manufacturing an article having a communicating hole. In addition, it relates to a method for manufacturing a semiconductor device by using a dual damascene process.

2. Description of the Related Art

Mostly, Cu has been used as a wiring material of semiconductor devices. However, it is difficult to transfer a pattern to Cu itself. Therefore, a damascene process, in particular a dual damascene process, in which a trench to be used for wiring or forming electrodes and a via are formed simultaneously, has been noted.

With respect to a method for manufacturing a semiconductor device by using this dual damascene process, a technology described in Japanese Patent Laid-Open No. 2004-221191 will be described.

Figure 9A:
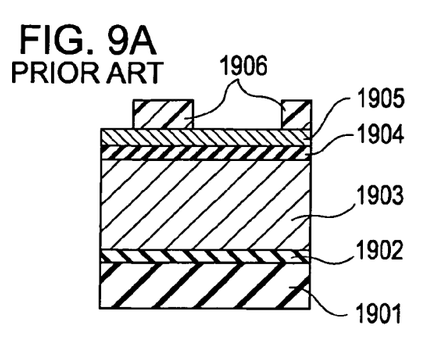
FIG. 9 is a schematic sectional view for explaining a known example.

In FIG. 9A, reference numeral 1901 denotes a Cu wiring, reference numeral 1902 denotes a SiC film, reference numeral 1903 denotes an organic low dielectric constant film, reference numeral 1904 denotes SiC, reference numeral 1905 denotes $SiO_2$, and reference numeral 1906 denotes a resist mask provided with a pattern of a wiring trench.

Figure 9B:
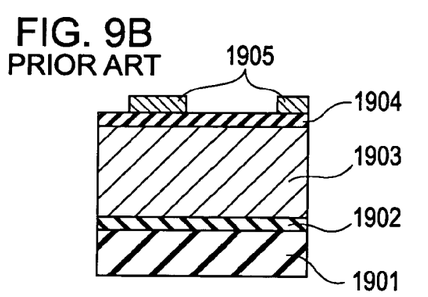
Figure 9C:
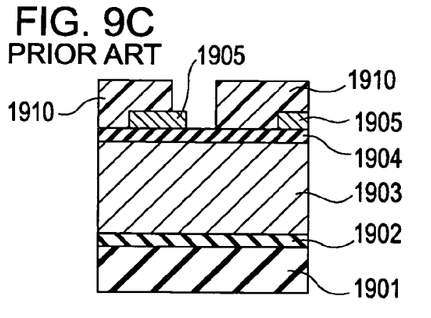

As shown in FIG. 9B, $SiO_2$ 1905 is etched through the use of the resist mask 1906. As shown in FIG. 9C, a photosensitive resist is applied all over the surface, and exposure and development are performed, so that a resist mask 1910 provided with a pattern of a via hole is formed.

Figure 9D:
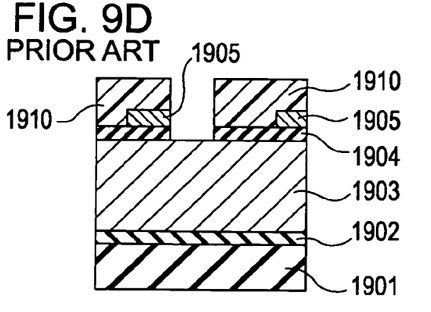
Figure 9E:
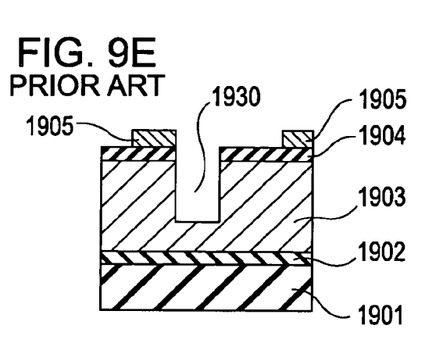

The $SiO_2$ film 1905 and the SiC film 1904 are etched by using the resulting resist mask 1910 (FIG. 9D). Thereafter, by using the two-layer hard mask (1904 and 1905), the organic low dielectric constant film 1903 is etched and, simultaneously, the resist mask 1910 is removed (FIG. 9E).

Figure 9F:
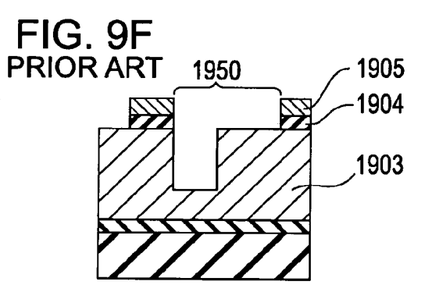

The SiC film 1904 is etched by using the $SiO_2$ film 1905 (FIG. 9F). Subsequently, the organic low dielectric constant film 1903 serving as an interlayer insulating film is etched by using the $SiO_2$ film 1905 and the SiC film 1904 as masks.

Figure 9G:
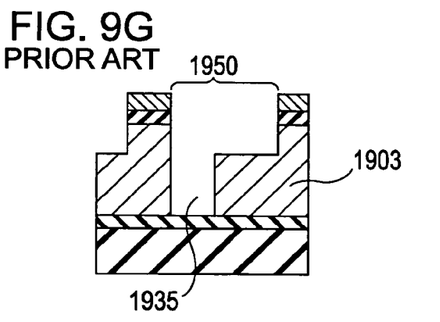
Figure 9H:
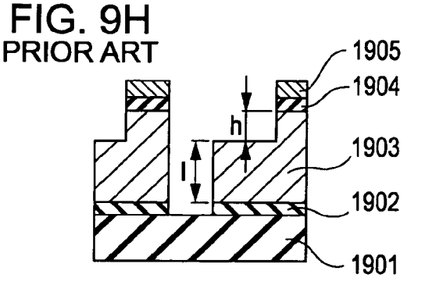

In this manner, a wiring trench 1950 and a via hole 1935 are produced (FIG. 9G). Finally, the SiC film 1902 is removed by using the $SiO_2$ film 1905 and the organic low dielectric constant film 1903 as masks (FIG. 9H). Subsequently, Cu is filled by plating into the wiring trench and the via hole, so that a dual damascene structure is produced.

In general, in the dual damascene process, a substrate layer made of a refractory metal, e.g., a barrier metal, and/or a refractory metal compound is formed in a trench to be used for wiring and a via hole and, thereafter, Cu, Al, an aluminum alloy, or the like is deposited.

Examples of deposition methods include a sputtering method, a CVD method, and if necessary, a process in which reflow is performed. The following removal of unnecessary Cu, Al, or the like can be performed not only by CMP, but also by physical removal, e.g., grinding and polishing, chemical etching, or the like.

SUMMARY OF THE INVENTION

However, as is clear from FIG. 9H, according to the above-described method, the length h in the depth direction of the wiring trench 1950 varies in correspondence with the length l in the depth direction of the via hole 1935.

Consequently, controllability of each of the lengths of the wiring trench and the via hole is not satisfactory in such a way that if the length h in the depth direction of the wiring trench is increased, the length l in the depth direction of the above-described via hole is decreased.

Accordingly, the present invention provides a method for manufacturing a semiconductor device or an article, in which the lengths in depth directions of a trench and a via hole are easily controlled.

A method for manufacturing a semiconductor device by using a dual damascene process, according to a first aspect of the present invention, includes the steps of preparing a component having a first insulating film on a substrate, disposing a layer on the above-described first insulating film, imprinting a mold having a pattern on the above-described layer so as to form a second insulating film having a wiring trench and a first via, the above-described pattern corresponding to the above-described wiring trench and the above-described first via, and etching the above-described first insulating film by using the above-described second insulating film as a mask so as to form a second via, which is longer than the above-described first via and which is connected to the first via, in the first insulating film.

A method for manufacturing a semiconductor device by using a dual damascene process, according to a second aspect of the present invention, includes the steps of preparing a component having a first insulating film, which has been subjected to a planarization treatment, on a substrate, disposing a layer on the above-described first insulating film, imprinting a mold having a pattern on the above-described layer so as to form a second insulating film having a wiring trench and a first via, the above-described pattern corresponding to the above-described wiring trench and the above-described first via, and etching the above-described first insulating film by using the above-described second insulating film as a mask so as to form a second via, which is connected to the above-described first via, in the first insulating film.

A method for manufacturing a semiconductor device by using a dual damascene process, according to a third aspect of the present invention, includes the steps of preparing a component having a first insulating film on a substrate, preparing a mold having a pattern corresponding to a wiring trench and a first via, interposing an ultraviolet curable resin layer between the above-described mold and the above-described first insulating film, irradiating the above-described resin layer with ultraviolet rays so as to cure the resin layer and form a second insulating film having the above-described wiring trench and the above-described first via, and etching the above-described first insulating film selectively by using the above-described second insulating film as a mask so as to form a second via, which is connected to the above-described first via, in the first insulating film.

A method for manufacturing a semiconductor device by using a dual damascene process, according to a fourth aspect of the present invention, includes the steps of preparing a component having a first insulating film on a substrate with an insulating layer therebetween, disposing a layer on the above-described first insulating film, imprinting a mold having a pattern on the above-described layer so as to form a second insulating film having a wiring trench and a first via, the above-described pattern corresponding to the above-described wiring trench and the above-described first via, etching the above-described first insulating film by using the above-described second insulating film as a mask so as to form a second via, which is connected to the above-described first via, in the first insulating film, and removing the insulating layer exposed at a bottom portion of the second via so as to form a third via connected to the above-described second via.

A method for manufacturing a semiconductor device by using a dual damascene process, according to a fifth aspect of the present invention, includes the steps of preparing a component having a first insulating film on a substrate, disposing a layer on the above-described first insulating film, imprinting a mold having a pattern on the above-described layer so as to form a second insulating film having a wiring trench and a first via, the above-described pattern corresponding to the above-described wiring trench and the above-described first via, and etching the above-described first insulating film by using the above-described second insulating film as a mask at an etching rate of the first insulating film more than or equal to 5 times that of the above-described second insulating film so as to form a second via, which is connected to the above-described first via, in the first insulating film.

A method for manufacturing an article having a communicating hole, according to a sixth aspect of the present invention, includes the steps of preparing a component having a first insulating film on a substrate, disposing a layer on the first insulating film, imprinting a mold having a pattern on the above-described layer so as to form a second insulating film having a trench and a first via, the above-described pattern corresponding to the above-described trench and the above-described first via, and etching the above-described first insulating film by using the above-described second insulating film as a mask so as to form a second via, which is longer than the above-described first via and which is connected to the first via, in the first insulating film.

A method for manufacturing an article having a communicating hole, according to a seventh aspect of the present invention, includes the steps of preparing a component having a first insulating film, which has been subjected to a planarization treatment, on a substrate, disposing a layer on the above-described first insulating film, imprinting a mold having a pattern on the above-described layer so as to form a second insulating film having a trench and a first via, the above-described pattern corresponding to the above-described trench and the above-described first via, and etching the above-described first insulating film by using the above-described second insulating film as a mask so as to form a second via, which is connected to the above-described first via, in the above-described first insulating film.

A method for manufacturing an article having a communicating hole, according to an eighth aspect of the present invention, includes the steps of preparing a component having a first insulating film on a substrate, forming a second insulating film on the first insulating film, forming a first photoresist film on the second insulating film, etching the second insulating film by using the first photoresist film as a mask, so as to form a first via in the second insulating film, forming a second photoresist film on the second insulating film having the first via therein, etching the second insulating film by using the second photoresist film as a mask, so as to form a wiring trench in the second insulating film, and etching the first insulating film by using the second insulating film having the first via and the wiring trench formed therein as a mask, so as to form a second via in the first insulating film, with the second via being connected to the first via.

According to the aspects of the present invention, since the above-described first insulating film constituting the via can be etched by using the above-described second insulating film, which constitutes the trench, as the mask, a method for manufacturing a semiconductor device or an article is provided, in which the lengths in depth directions of the wiring trench and the via hole are easily controlled.

Further features of the present invention will become apparent from the following description of exemplary embodiments with reference to the attached drawings.

DESCRIPTION OF THE EMBODIMENTS

First Embodiment

The first embodiment according to an aspect of the present invention will be described with reference to FIGS. 1A and 1B.

Figure 1A:
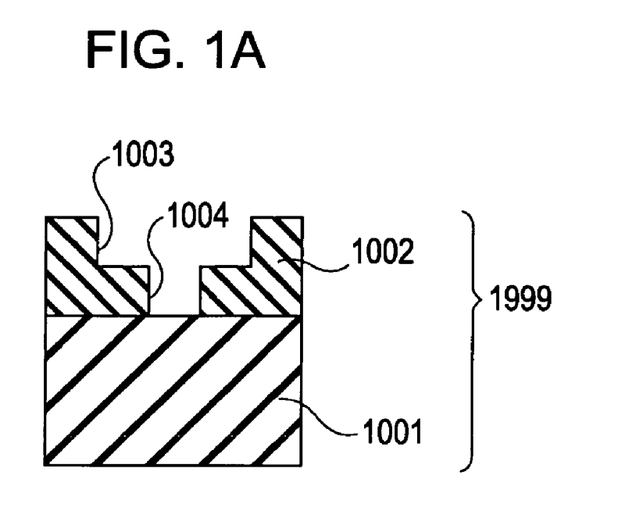
FIGS. 1A and 1B are schematic sectional views showing a method for manufacturing a component, according to an aspect of the present invention.

A component 1999 having a first insulating film 1001 and a second insulating film 1002 is prepared on a substrate (not shown in the drawing) (FIG. 1A).

The above-described second insulating film 1002 is produced by disposing a layer on the above-described first insulating film 1001 and, thereafter, imprinting a mold (not shown in the drawing) having a pattern on the layer, the pattern corresponding to a wiring trench 1003 and a first via 1004.

For example, a material constituting the layer is solidified while being in contact with the above-described mold and, thereby, the second insulating film is produced.

The layer in the present invention includes the case where the material for forming the second insulating film is macroscopically in the shape of a layer on the first insulating film, but is microscopically in the shape of dots.

Furthermore, the layer in the present invention also includes the case where the material for forming the second insulating film is composed of an assembly of a plurality of dot-shaped materials at the stage of being disposed on the first insulating layer, and becomes into the shape of a layer by contacting the above-described mold. The same holds true for the other embodiments.

Subsequently, the above-described first insulating film 1001 is etched by using the above-described second insulating film 1002 as a mask. Consequently, a second via, which has a length t longer than the length s of the first via and which is connected to the first via, is formed in the first insulating film (FIG. 1B).

The second via 1005 is not necessarily allowed to penetrate the first insulating film 1001 by the above-described etching. In the case where the second via 1005 is allowed to penetrate, an insulating or electrically conductive layer, a film, or a substrate (not shown in the drawing) is exposed at a bottom side of the second via 1005.

For example, a wiring formed from a metal, e.g., Cu, is exposed at the bottom of the second via. In some cases, an electric wiring (not shown in the drawing) is disposed at the bottom of the second via while an insulating material (not shown in the drawing) for functioning as an etching stop layer and/or a metal-diffusion-preventing layer is interposed.

In the case where an electric wiring layer disposed between the above-described first insulating film 1001 and the above-described substrate (not shown in the drawing) is not exposed at the bottom side of the above-described second via 1005 after the above-described etching, if necessary, a treatment to expose the electric wiring layer is performed. For example, etching or ashing is performed.

Here, it is important to select a material for the insulating film in such a way that the first insulating film 1001 can be etched by using the second insulating film 1002 as a mask. Consequently, the length of the via can be controlled by the length of the first insulating film.

When the second via is formed in the first insulating film, the length in the depth direction of the wiring trench 1003 is allowed to hardly become larger than or equal to a predetermined length. Here, the predetermined length refers to, for example, the thickness of the second insulating film.

For the combination of the materials to realize the present invention, for example, hydrogen silsesquioxane (HSQ) is selected as the material for the second insulating film, and polyaryl ether (PAE) is selected as the material for the first insulating film.

For dry etching of PAE, $NH_3$ is used as an etchant. The etching is performed under the condition of, for example, 50 sccm to 300 sccm, a pressure of 2 Pa to 20 Pa, and a power of an RF power supply of 100 W to 800 W by using a reactive ion etching apparatus. Furthermore, $N_2/H_2$ or $N_2/NH_3$ can also be applied as the etchant.

In the case where $NH_3$ is used as the etchant, HSQ is not etched substantially depending on the condition. Therefore, the second insulating film 1002 functions as a mask.

The present invention includes not only the case where the second insulating film is not etched substantially with the etchant of the first insulating film, but also the case where the first insulating film is etched selectively. The case where the first insulating film tends to be selectively etched as compared with the second insulating film refers to, for example, the case where there is a difference of 5 times or more in terms of an etching rate. It is effective that there is a difference of 10 times or more. As a matter of course, it is very effective that there is a difference of 100 times or more.

Figure 3:
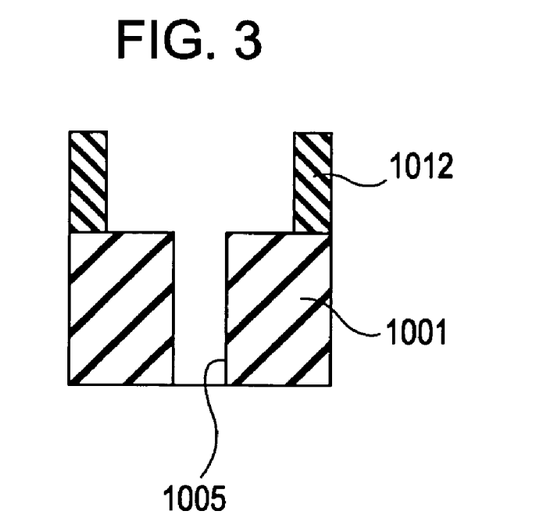
FIG. 3 is a schematic sectional view showing an example of a component having a wiring trench and a via hole, according to an aspect of the present invention.

The method for manufacturing a semiconductor device according to an aspect of the present invention also includes the case where, as shown in FIG. 3, the first via having been disposed in the second insulating film 1012 is substantially eliminated at the point in time when the second via 1005 is formed in the first insulating film.

(a) Relationship Between Length s of First Via and Length t of Second Via

In order that the length t of the above-described second via is allowed to become larger than the length s of the above-described first via, the thickness (length in the film thickness direction) of the above-described first insulating film 1001 is allowed to be larger than the length s of the above-described first via. The thickness of the above-described first insulating film can be larger than the thickness of the above-described second insulating film. The length t of the above-described second via can be more than or equal to twice the length s of the above-described first via. It is advantageous that the length is more than or equal to 3 times. For the upper limit, the length t of the above-described second via is, for example, less than or equal to 20 times the length s of the above-described first via, and it can be less than or equal to 10 times.

(b) First Insulating Film

The above-described first insulating film can be appropriately selected from organic materials or porous inorganic materials, each having a relative dielectric constant k of 4.0 or less.

Specific examples thereof include polyaryl ether PAE (k=2.65) serving as an organic film, porous $SiO_2$ (k=1.5 to 2.0), SiOF (k=3.6), and SiOC (k=2.9). Inorganic materials can be made porous in order to have a configuration suitable for being etched selectively as compared with the second insulating film.

With respect to an interlayer insulating film of a semiconductor wiring, it is said that the relative dielectric constant of 4.0 or less is suitable for the 90-nm generation, and a low dielectric constant of 2.5 or less is suitable for the 65-nm generation or later. Therefore, the method for manufacturing a semiconductor device provided according to the present embodiment can be applied to a finer wiring. In this connection, the relative dielectric constant of SiN is 7.0 and that of SiC is 5.0. The lower limit of the relative dielectric constant according to the present embodiment is 1.5, for example.

The above-described PAE, polyimide, Parylene, Teflon (registered trade mark), benzocyclobutene (BCB), perfluorocarbon (PTFE), and the like are included. Resins, e.g., PMMA, can also be used.

For the first insulating film, a porous inorganic Low-k material can also be used. Examples thereof include porous silica, porous methylsilsesquioxane (porous MSQ), and porous SiOC.

In dry etching of these first insulating films, the etchant is selected appropriately from a mixed gas of $N_2$ and $H_2$, an $NH_3$ gas, a mixed gas of $N_2$ and $NH_3$, an oxygen gas, and the like for organic films.

For porous inorganic materials, fluorocarbon based (CF based) gases (for example, $C_3F_8$, $C_4F_8$, $C_5F_8$, $C_4F_6$, $CHF_3$, and $CF_4$) are used. The CF based gases may be in common with the etchant in the etching of the second insulating film. However, the first insulating film is porous and, therefore, is etched selectively as compared with the second insulating film.

(c) Second Insulating Film

The above-described second insulating film can be selected from hydrogen silsesquioxane, siloxane containing an epoxy group, and silsesquioxane containing an epoxy group.

Examples of materials usable for the second insulating film include the above-described HSQ, siloxane containing an epoxy group, and mixtures of silsesquioxane (SSQ containing an epoxy group). Besides, silicon oxide, fluorine-doped silicon oxide, carbon-doped silicon oxide, SiOC, or the like can be used. Silsesquioxane containing an epoxy group is reported, for example, by Michael et al., "SPIE Microlithography Conference, February 2003." (http://www.molecularimprints.com/NewsEvents/tech_articles/D ual-damascene-MLO5%205751-21.pdf).

In particular, in the case where the wiring trench and the first via disposed in the second insulating film are formed by using the imprinting method, the second insulating film can be a UV curable resin.

In dry etching of the second insulating film, fluorocarbon based (CF based) gases (for example, $C_3F_8$, $C_4F_8$, $C_5F_8$, $C_4F_6$, $CHF_3$, and $CF_4$) can be used as the etchant.

At least one of the first insulating film and the second insulating film has a relative dielectric constant of 4.0 or less. The relative dielectric constant can be 3.0 or less, and furthermore, it can be 2.5 or less.

In particular, both the first insulating film and the second insulating film can be composed of a material having a relative dielectric constant of 3.0 or less. Furthermore, the relative dielectric constant can be 2.5 or less.

The second insulating film itself having the wiring trench and the first via according to an aspect of the present invention can be composed of a single layer film rather than a multilayer film. The reason for this is believed that the process becomes more complicated when being composed of a multilayer film.

(d) Substrate

The substrate to be provided with the first insulating film 1001 is, for example, a silicon wafer, a SiGe wafer, or a substrate having a multilayer film. The substrate and the first insulating film may be in direct contact with each other, or an alternative layer (regardless of whether the layer is a single layer or a multilayer) may be interposed and, thereby, the above-described first insulating film may be disposed indirectly on the substrate.

For example, a region including an electric wiring is disposed on a silicon substrate, a diffusion-preventing layer of a metal material constituting the electric wiring is further disposed on the region, and the above-described first insulating film can be disposed thereon.

(e) Imprint

The component 1999 according to the present embodiment will be described below.

The component including the second insulating film 1002, which has the wiring trench 1003 and the first via 1004, on the first insulating film 1001 (FIG. 1A) can be formed as described below, for example.

The imprint is described in, for example, U.S. Pat. No. 6,334,960 and Stephan Y. Chou et al., Appl. Phys. Lett., Vol. 67, Issue 21, pp. 3114-3116 (1995).

Figure 4A:
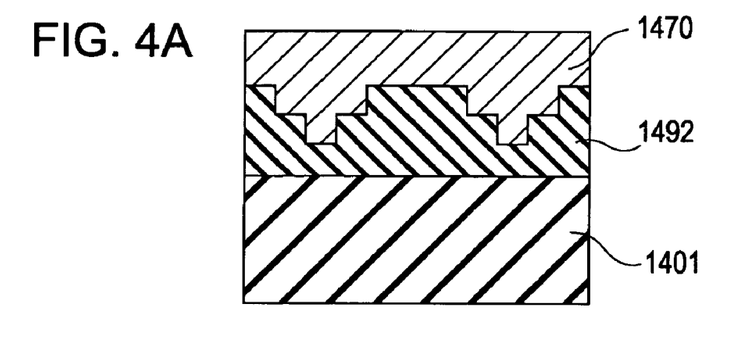
FIGS. 4A to 4C are schematic sectional views showing a method for manufacturing a component, according to an aspect of the present invention.
Figure 4B:
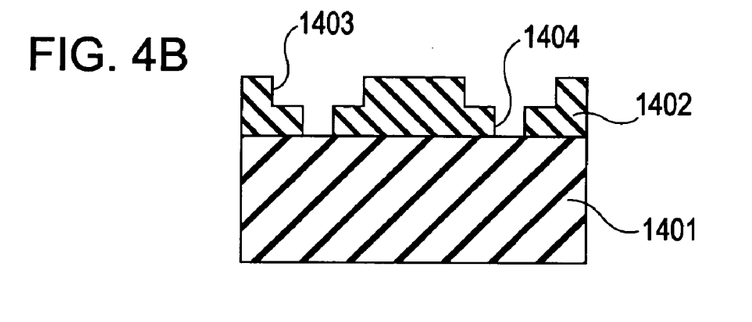
Figure 4C:
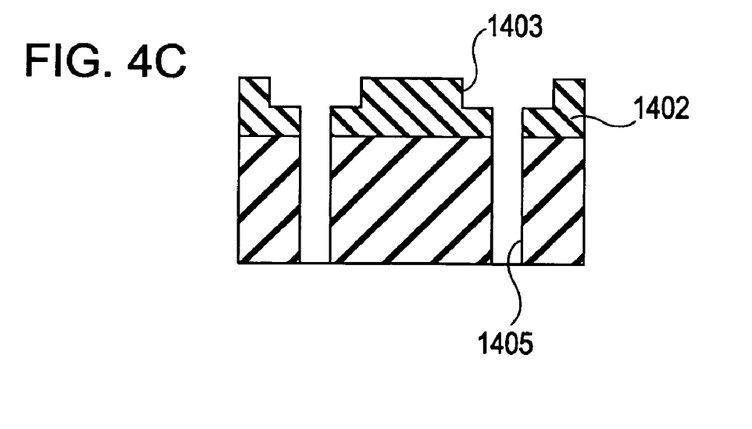

The explanation will be provided with reference to FIGS. 4A to 4C.

Specifically, a mold 1470 having a predetermined imprint pattern and a material (a photocurable resin) capable of serving as a second insulating film are brought into direct or indirect contact with each other on a first insulating film 1401. If necessary, a pressure is applied to press the two.

The above-described pattern is formed in correspondence with a wiring trench and a first via.

In the case where the above-described material is an ultraviolet curable resin, the resin is irradiated with UV light to cure, so that the pattern of the mold is transferred (FIG. 4A).

The above-described HSQ or the like can be used as the material for forming the second insulating film.

As a matter of course, in the imprint method, a thermosetting resin (for example, PMMA and the above-described HSQ) can also be used as a material for forming the second insulating film in place of the photocurable resin.

A thermosetting type imprint method includes a system in which a pattern is transferred to a solid resin through application of heat and a system in which a pattern is transferred through application of heat to a liquid resin. Both systems can be used in the present invention.

In FIG. 4A, reference numeral 1492 denotes the second insulating film formed by curing and provided with a concave portion corresponding to the wiring trench and the first via. Thereafter, the mold 1470 and the second insulating film 1492 are separated from each other. Sometimes, imprint is performed while a mold release agent is interposed between the mold and the resin.

As shown in FIG. 4B, all over the surface of the second insulating film is etched back by dry etching through the use of a CF based gas, so that the second insulating film 1402 having the first via 1404 and the wiring trench 1403 is formed.

The step shown in FIG. 4B can be performed as needed. For example, in the case where the configuration shown in FIG. 4B can be obtained by the imprint, that is, in the case where the second insulating film is substantially not left on the bottom of the first via or is left simply as a very thin film, the above-described etch back can be omitted.

In this manner, the above-described component 1999 can be produced.

Subsequently, a second via 1405 is formed in the first insulating film 1401 by using the second insulating film 1402 as a mask (FIG. 4C).

After the above-described second via is formed, an electrically conductive material made of Cu or the like is filled in the above-described wiring trench, the above-described first via, and the second via.

Although depending on the extent of the above-described etch back, the present invention also includes the case where, for example, the first via in the second insulating film is eliminated, as shown in FIG. 3. In this case, s=0.

(f) Filling

Figure 1B:
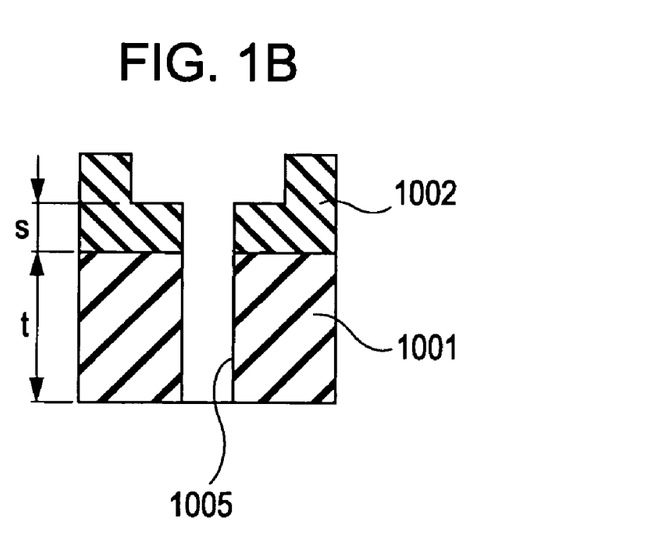
Figure 2:
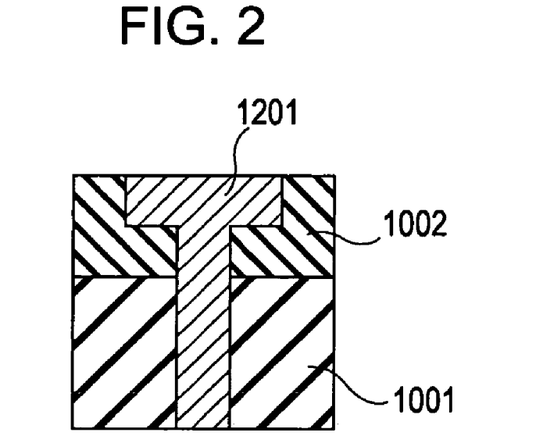
FIG. 2 is a schematic sectional view showing the case where an electrically conductive material is filled in a component having a wiring trench and a via hole, according to an aspect of the present invention.

After the wiring trench and the second via (via hole) shown in FIG. 1B or FIG. 2 are formed, an electrically conductive material (for example, Cu) 1201 is filled therein.

Before the electrically conductive material is filled in, a refractory metal, e.g., Ti, TiN, Ta, TaN, W, and WN, and/or a refractory metal compound can be formed as a substrate layer on a side surface and a bottom surface of the wiring trench and a side surface and a bottom surface of the second via. The substrate layer is formed by a sputtering method or a CVD method.

In the case where a material, although not shown in the drawing, exposed at the bottom of the second via shown in FIG. 1B is an insulating material, e.g., SiC, and an electrically conductive wiring region is disposed under the material, the electrically conductive material is filled in after the SiC or the like exposed at the bottom is removed. As a matter of course, in the present invention, the electrically conductive material can be filled in as needed. For the use as a porous body to function as a mirror, the filling is unnecessary.

Sometimes, an oxide film of the electrically conductive material (Cu) is formed on the surface layer of the material exposed at the bottom of the second via. In such a case, the exposed Cu surface can be subjected to cleaning. For example, the oxide is removed by Ar sputtering, or the oxide is reduced by a heat treatment in an atmosphere containing a hydrogen gas.

In the filling, as a first step, a metal film (barrier metal) can be grown on the side walls of the wiring trench and the via hole (a hole resulting from connection of the first via and the second via) through sputtering growth. A seed Cu layer to function as an electrode for filling can be formed, and Cu can be filled in by plating.

(g) Others

For the component 1999 shown in FIG. 1A, if necessary, another insulating film can also be disposed between the first insulating film 1002 and the second insulating film 1001 or under the first insulating film. Examples thereof include SiC, SiOC, SiN, and $SiO_2$.

In the dual damascene process according to the present invention, the above-described trench portion is not necessarily used for a wiring, but the trench can be used for forming a pixel electrode, for example.

Examples of semiconductor devices according to an aspect of the present invention include the following devices.

These are, for example, semiconductor integrated circuits, memory devices, e.g., DRAM, SRAM, and flash memory, CMOS devices, and image capture devices (CCD and the like).

The technical matters explained in the above-described items (a) to (g) can be adopted appropriately in the following embodiments as long as there is no contradiction between the technical ideas.

Second Embodiment

Planarization

The second embodiment according to another aspect of the present invention is a method for manufacturing a semiconductor device by using a dual damascene process as in the above description. However, it is characterized by including the steps of preparing a component having a first insulating film, which has been subjected to a planarization treatment, on a substrate.

The present embodiment will be described with reference to FIGS. 6A to 6E.

Figure 6A:
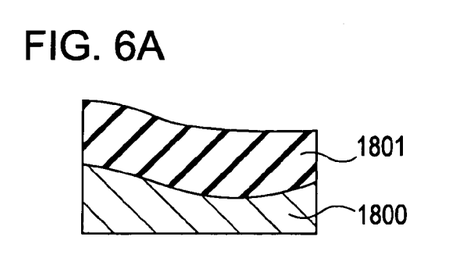
FIGS. 6A to 6E are schematic sectional views showing a method for manufacturing a component, according to an aspect of the present invention.

In FIG. 6A, reference numeral 1800 denotes a substrate having unevenness.

Here, the substrate includes a substrate composed of a multilayer film. The above-described multilayer film includes an electrically conductive layer formed from Cu or the like or an insulating layer formed from SiC or the like.

A first insulating film 1801, which has been subjected to a planarization treatment so as to reduce the unevenness, is disposed on the substrate 1800.

The planarization treatment includes at least two concepts described below.

A first concept is that the first insulating film is formed on the substrate 1800 and, thereafter, planarization is performed by polishing, heat treatment, or the like. A second concept is that the unevenness of the substrate is reduced by contrivances in the formation of the first insulating film on the substrate. For example, the contrivance refers to that the insulating film is formed by spin coating. As a matter of course, the planarization treatment can also be performed in combination of the two concepts.

In the case where the first insulating film is formed by the spin coating, an insulating film has a surface shape in which the unevenness of the substrate 1800 are reduced to some extent (FIG. 6A). In the case where an insulating material having a very low viscosity is used, the state shown in FIG. 6B may result at the point in time when the first insulating film is formed by spin coating.

Figure 6B:
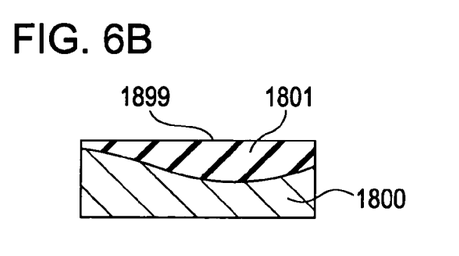

The surface of this first insulating film 1800 is subjected to a planarization treatment by chemical mechanical polishing (CMP), if necessary, (FIG. 6B). In FIG. 6B, reference numeral 1899 denotes the outermost surface of the insulating film which has been subjected to a surface planarization treatment.

Figure 6C:
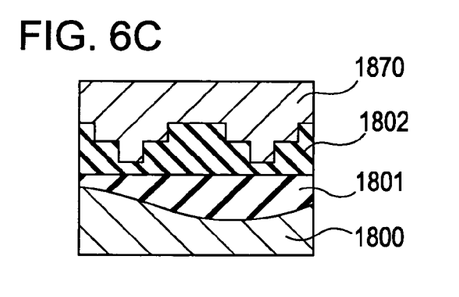

A second insulating film is applied by spin coating, dispenser, or the like to the first insulating film 1801 having been subjected to the planarization treatment. The second insulating film 1802 is irradiated with UV light while being pressured with a mold 1870 having a desired pattern, so as to cure (FIG. 6C). The mold is formed from quartz or the like. In this manner, the mold surface pattern is transferred to the second insulating film 1802.

Figure 6D:
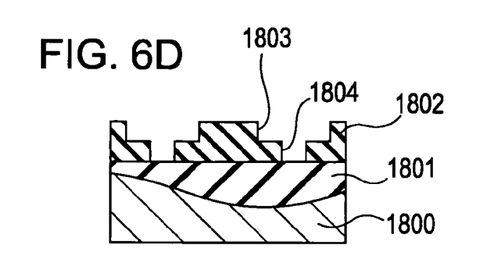

Thereafter, etch back is performed by etching through the use of a CF based gas, so that the first insulating film 1801 is exposed at the bottom of a first via 1804 included in the second insulating film (FIG. 6D).

Figure 6E:
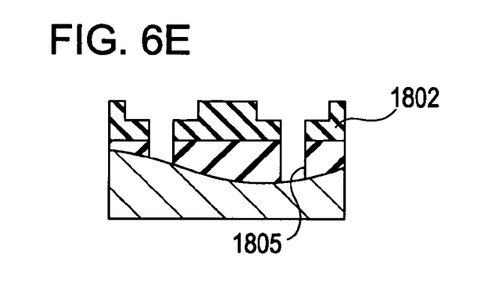

A second via 1805 is formed in the first insulating film by using the second insulating film 1802 as a mask (FIG. 6E).

Figure 7:
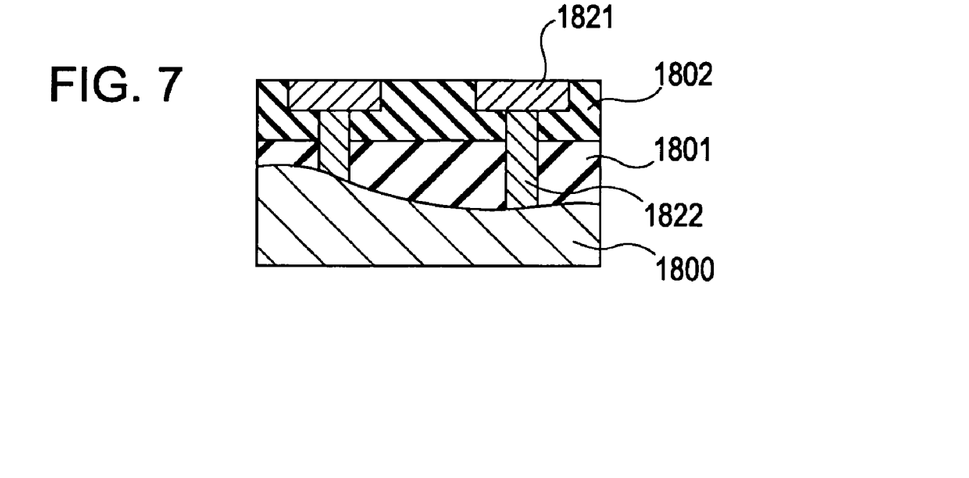
FIG. 7 is a schematic sectional view showing the case where an electrically conductive material is filled in a component having a wiring trench and a via hole, according to an aspect of the present invention.

The thus formed wiring trench 1803 and the via hole are filled with Cu by a plating method after a barrier metal or a Cu seed layer is formed by a sputtering method, if necessary. Subsequently, polishing is performed through CMP, so that a via wiring 1822 and a trench wiring 1821 are formed simultaneously (FIG. 7).

The etch back can be performed as described above, if necessary. As a matter of course, a known thermal imprint method can also be applied in place of the photo-imprint method.

Figure 8A:
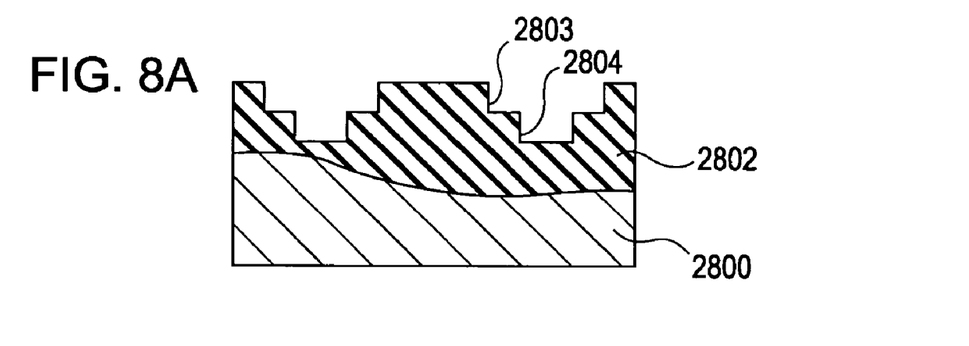
FIGS. 8A and 8B are schematic sectional views showing a manufacturing method, for explaining usefulness of an aspect of the present invention.
Figure 8B:
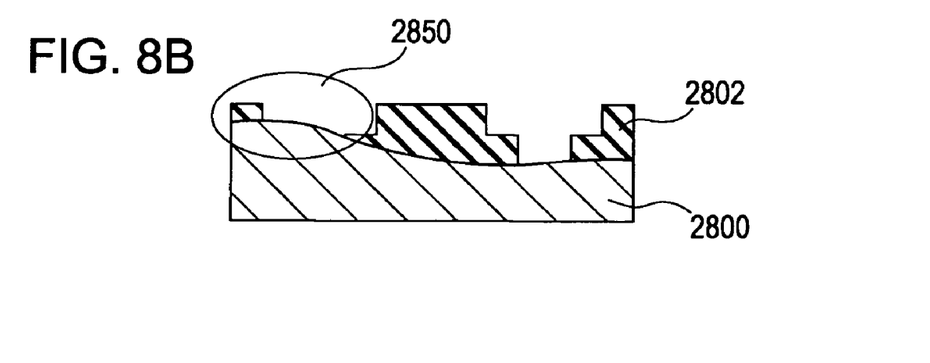

FIGS. 8A and 8B show the case where a dual damascene process is applied to a single layer insulating film, for explaining usefulness of the present embodiment according to an aspect of the present invention.

In the case where a substrate 2800 has unevenness, when a UV curable resin 2802 is applied to the substrate and a pattern is transferred by using a mold, the state shown in FIG. 8A results.

If etch back is performed in such a state in order to expose the substrate 2800 at the bottom of the first via 2804, the holes for a wiring trench and a via hole are eliminated partly, as indicated by a circled portion 2850 shown in FIG. 8B.

On the other hand, in the present embodiment according to an aspect of the invention, since the surface unevenness of the substrate is absorbed by the first insulating film and the second insulating film is disposed thereon, the event that the wiring trench is eliminated, as shown in FIG. 8B, can be avoided.

Furthermore, the combination of the materials for the first insulating film and the second insulating film can be selected in such a way that a desired etching selection ratio can be ensured. In that case, the length of the wiring trench in the depth direction is allowed to be hardly increased to more than or equal to a predetermined length (for example, the film thickness of the second insulating film) even when the length of the hole for the via wiring in the depth direction is increased. Accordingly, this is a very useful method when it is desired that the depth of the wiring trench is not increased unnecessarily or the amount of filling material, e.g., Cu, to be filled in is not increased.

(h) Planarization Treatment

The above-described planarization treatment can also be realized by heat-treating the above-described first insulating film in place of the CMP or together with the CMP. For example, planarization can be realized by an annealing treatment in an atmosphere at a temperature higher than the temperature during film formation.

In FIG. 4A, when unevenness of the first insulating film 1401 itself is generated under the influence of the unevenness of a layer (not shown in the drawing) located under the first insulating film 1401, planarization can be performed by the following technique in place of polishing through CMP or the like.

Specifically, a technique (blank imprint method), in which planarization is performed by using a UV curable resin as the first insulating film and imprinting a mold provided with no uneven surface pattern on the insulating film, is used.

When the imprint method is used, it may be required that alignment of the mold with the substrate in the in-plane direction and adjustment of a gap between the two are performed very precisely.

When the flatness of the substrate is poor, it may be difficult to perform such precise gap adjustment and the like. However, when the present invention is applied, the flatness of the outermost surface can be improved by the first insulating film to be formed on the substrate. Therefore, the required precise gap adjustment and the like can be performed.

Third Embodiment

Photo-Imprint

A method for manufacturing a semiconductor device according to the third embodiment of the present invention is performed as described below.

A component having a first insulating film is prepared on a substrate.

Furthermore, a mold having a pattern corresponding to a wiring trench and a first via is prepared.

An ultraviolet curable resin layer is interposed between the above-described mold and the above-described first insulating film, and the above-described resin layer is irradiated with ultraviolet rays so as to cure.

After the resin is cured, the above-described mold and the resin are separated from each other. If necessary, the above-described cured resin is subjected to anisotropic etching (so-called etch back step).

In this manner, a second insulating film having the above-described wiring trench and the above-described first via can be produced.

The above-described first insulating film is selectively etched by using the above-described second insulating film as a mask so as to form a second via, which is connected to the above-described first via, in the first insulating film.

With respect to the substrate, the first and the second insulating films, the resin layer, and the etching step in the present embodiment, the content explained in the first and the second embodiments can be adopted appropriately.

Fourth Embodiment

Three-Layer Configuration

The fourth embodiment according to another aspect of the present invention is a method for manufacturing a semiconductor device by using a dual damascene process, and has the following features.

A component having a first insulating film is prepared on a substrate with an insulating layer therebetween.

A layer is disposed on the above-described first insulating film.

A mold having a pattern corresponding to a wiring trench and a first via is imprinted on the above-described layer so as to form a second insulating film having the wiring trench and the first via.

The above-described first insulating film is etched by using the above-described second insulating film as a mask so as to form a second via, which is connected to the above-described first via, in the first insulating film.

The insulating layer exposed at a bottom of the second via is removed, and a third via connected to the above-described second via is formed. The above-described insulating layer is composed of, for example, SiN or SiC, in order to prevent metal diffusion from a metal wiring or to function as an etching stopper layer. The relative dielectric constant is not necessarily 4 or less, but may be 4.1 or more.

With respect to the substrate, the first and the second insulating films, the resin layer, and the etching step in the present embodiment, the content explained in the first and the second embodiments can be adopted appropriately.

For example, in the configuration, a metal wiring layer can be disposed on a silicon substrate, the above-described insulating layer for preventing the metal diffusion can be disposed thereon, and the above-described first insulating film and the second insulating film can be further disposed thereon.

For example, an insulating material (for example, SiN or SiC) having a relative dielectric constant of 4.1 or more is used inevitably in order to prevent the metal diffusion. On the other hand, when it is not desirable that the relative dielectric constant of the interlayer insulating film is increased, the above-described insulating layer can be made thinner than the first insulating film.

In the above-described first to the fourth embodiments, the component 1999 schematically shown in FIG. 1A may be prepared not by using the imprint method (first formation method), but by using a second formation method which will be explained as follows with reference to FIGS. 5A to 5H.

In this second formation method, the component 1999 itself is formed by a so-called dual damascene process and, thereafter, the lower first insulating film is etched by using the second insulating film as a mask.

In general, the dual damascene process includes a trench-first system, in which an exposure process for the wiring trench is performed first, and a via-first system, in which an exposure process for the via hole is performed first. Either one of the techniques can be adopted as long as the shape shown in FIG. 1A is produced.

For example, the dual damascene process through the use of the via-first system will be described below with reference to FIGS. 5A to 5H.

Figure 5A:
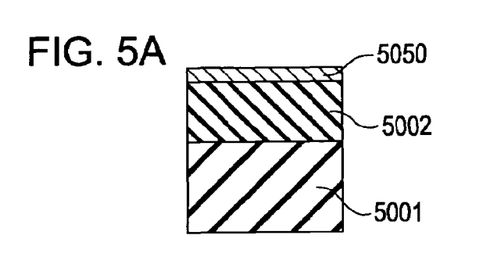
FIGS. 5A to 5H are schematic sectional views showing a method for manufacturing a component, according to an aspect of the present invention.

In FIG. 5A, a wiring layer, although not shown in the drawing, formed from Cu or the like is disposed under a first insulating film 5001 with a SiC insulating layer therebetween, if necessary.

A second insulating film 5002 and a sacrificial film 5050 for CMP are deposited sequentially on the first insulating film 5001 by a CVD method or the like (FIG. 5A). The sacrificial film for CMP is formed from $SiO_2$, SiC, SiN, or the like.

Figure 5B:
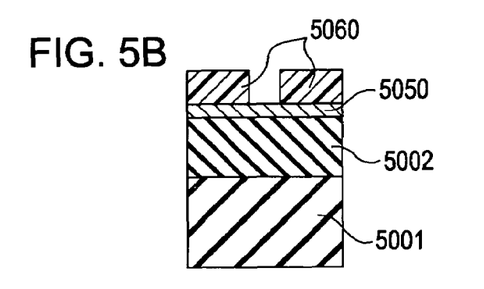

A photoresist film 5060 exposing a via portion formation region is formed on the sacrificial film 5050 by photolithography (FIG. 5B).

Figure 5C:
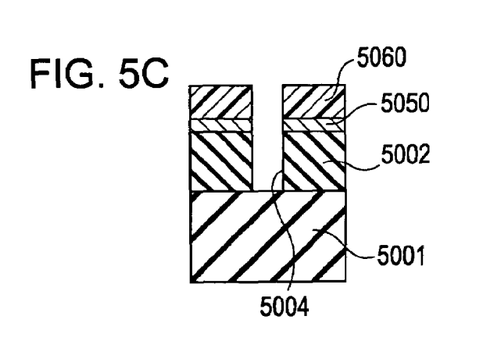

The sacrificial film 5050 for CMP and the second insulating film are etched by using the photoresist film 5060 as a mask, so that a via hole 5004 reaching the first insulating film is formed (FIG. 5C).

Figure 5D:
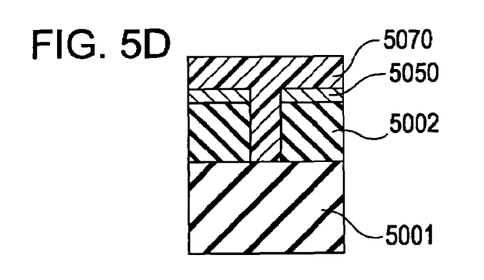

After the photoresist film 5060 is removed, a resin material, e.g., a photoresist, is applied and heat-curing is performed, so that the via hole 5004 is filled with a filling material 5070 composed of this resin material (FIG. 5D).

Figure 5E:
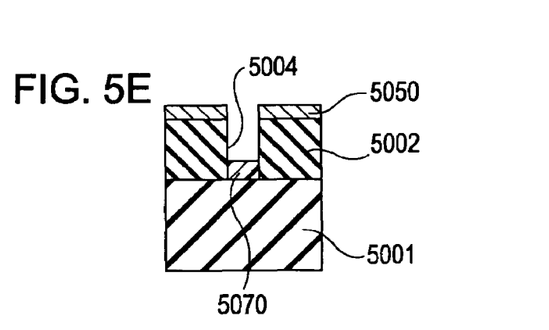

The filling material 5070 is etched back, so that the filling material is simply left on the bottom of the via hole 5004 (FIG. 5E).

Figure 5F:
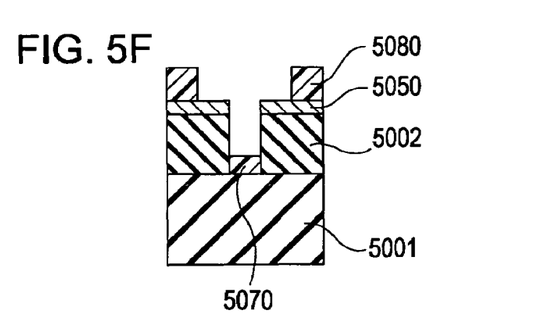

A photoresist film 5080 exposing a wiring trench portion formation region is formed on the sacrificial film 5050 for CMP by photolithography (FIG. 5F).

Figure 5G:
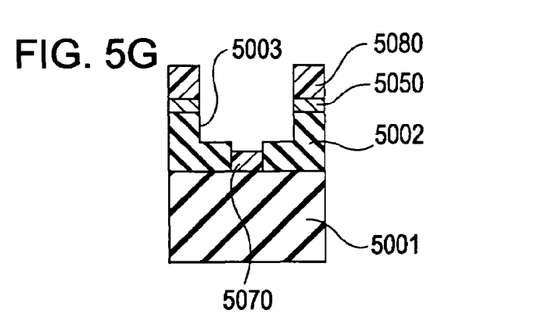
Figure 5H:
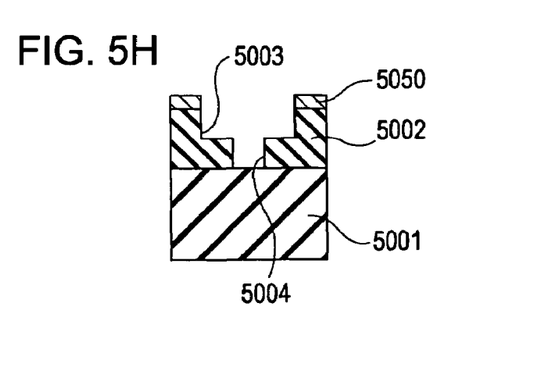

The sacrificial film 5050 for CMP and the second insulating film 5002 are etched by using the photoresist film 5080 as a mask, so that a wiring trench 5003 is formed in the sacrificial film for CMP and the second insulating film (FIG. 5G).

Thereafter, the filling material 5070 is removed together with the photoresist film 5080 by ashing, for example.

In this manner, an opening portion having the via hole 5004 and the wiring trench 5003 can be formed in the sacrificial film 5050 for CMP and the second insulating film 5002.

The second technique for forming the above-described component has been explained with reference to the case where the sacrificial film for CMP has been included. However, the sacrificial film can be omitted. Conversely, the sacrificial film for CMP can be disposed in the first technique.

With respect to the explanations with reference to FIGS. 5A to 5H, the step shown in FIG. 1B, that is, the step of etching the first insulating film 5001 can also be performed while the resist film 5080 is left on the sacrificial film 5050 (FIG. 5G).

This is because the first insulating film can be etched selectively as long as the filling material 5070 is removed during the etching step and the insulating film is exposed at the bottom of the first via, although depending on the depth of the second via. The process shown by FIG. 5A to FIG. 5H is not necessarily followed. For example, after the steps shown in FIG. 5A, FIG. 5B, and FIG. 5C are performed, the resist for the wiring trench is applied and patterned without performing the step shown in FIG. 5D and, thereby, the wiring trench 5003 can be formed as well.

Fifth Embodiment

The fifth embodiment according to another aspect of the present invention is a method for manufacturing an article having a communicating hole, and has the following features.

A component having a first insulating film on a substrate is prepared, and a layer is disposed on the above-described first insulating film.

A mold having a pattern corresponding to the trench and the first via is imprinted on the above-described layer so as to form a second insulating film having the trench and the first via.

The above-described first insulating film is etched by using the above-described second insulating film as a mask so as to form a second via, which is connected to the above-described first via, in the first insulating film.

The length of the above-described second via can be made longer than the length of the above-described first via. Furthermore, the above-described first insulating film can be subjected to the above-described planarization treatment before the above-described second insulating film is stacked thereon.

The present embodiment according to an aspect of the invention is similar to the first and the second embodiments according to other aspects of the invention. For example, when an article according to the present embodiment is used as an antireflection film, the material, e.g., a metal, is not necessarily filled in the communicating hole prepared.

The article according to the present embodiment also includes a semiconductor device provided with a pixel electrode, the device being referred to as LCOS (liquid crystal on silicon) to be used for a display device including a liquid crystal.

That is, the present invention includes an article in which the above-described trench, the first via, and the second via are filled with a metal material to function as a reflection material.

The method for manufacturing a semiconductor device according to an aspect of the present invention will be described below in detail with reference to Example. In the following Example, the present invention is applied to the case where a substrate located under a first insulating film has unevenness.

EXAMPLE

An aspect of the present invention will be described with reference to FIG. 6A to FIG. 6E.

In FIG. 6A, reference numeral 1800 denotes a substrate having unevenness. Examples of substrates here include an electrically conductive layer formed from Cu or the like and an insulating layer formed from SiC or the like. A first insulating film (PAE) 1801 is formed on a substrate having surface unevenness by spin coating. In this case, the insulating film has a surface shape reflecting the unevenness of the substrate 1800 (FIG. 6A).

The surface of this first insulating film 1801 is subjected to a planarization treatment by CMP (FIG. 6B). In FIG. 6B, reference numeral 1899 denotes the insulating film having the surface subjected to the planarization treatment.

A layer for forming a second insulating film (silsesquioxane or siloxane, each containing an epoxy group) is applied by spin coating to the first insulating film 1801 having been subjected to the planarization treatment. The layer for forming the second insulating film 1802 is irradiated with UV light while being pressured with a mold 1870 having a desired pattern, so as to cure (FIG. 6C). In this manner, the mold surface pattern is transferred to the second insulating film 1802.

Thereafter, etch back is performed by etching through the use of a CF based gas, so that the first insulating film 1801 is exposed at the bottom of a first via 1804 included in the second insulating film (FIG. 6D).

A second via is formed in the first insulating film by using the second insulating film 1802 as a mask in a dry etching apparatus (FIG. 6E). In the apparatus, a gas, e.g., $NH_3$, is used as an etching gas. Consequently, the first insulating film is etched selectively.

The thus formed wiring trench and the via hole are filled in with Cu by a plating method after a barrier metal or a Cu seed layer is formed by a sputtering method, if necessary. Subsequently, polishing is performed through CMP, so that a via wiring 1822 and a trench wiring 1821 are formed simultaneously (FIG. 7).

The method for manufacturing a semiconductor device by using a dual damascene process according to an aspect of the present invention can be applied to, for example, wiring layers of semiconductor integrated circuits, DRAM, and CMOS devices. Not limited to those related to wirings, it can be applied to other fields, for example, manufacture of an antireflection film through the use of unevenness.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-353752 filed Dec. 7, 2005 and No. 2006-277726 filed Oct. 11, 2006, which are hereby incorporated by reference herein in their entirety.

What is claimed is:

1. A method for manufacturing a semiconductor device by using a dual damascene process, comprising the steps of:
preparing a component having a first insulating film on a substrate;
disposing a layer on the first insulating film;
imprinting a mold having a pattern on the layer so as to form a second insulating film having a wiring trench and a first via, the pattern corresponding to the wiring trench and the first via;
etching the first insulating film by using the second insulating film as a mask so as to form a second via, which is longer than the first via and which is connected to the first via, in the first insulating film; and
filling an electrically conductive material in the wiring trench, the first via, and the second via.

2. The method for manufacturing a semiconductor device according to claim 1, wherein the length of the second via is more than or equal to twice the length of the first via.

3. The method for manufacturing a semiconductor device according to claim 1, wherein the first insulating film comprises an organic material or a porous inorganic material, each having a relative dielectric constant of 4.0 or less.

4. The method for manufacturing a semiconductor device according to claim 1, wherein the layer is selected from hydrogen silsesquioxane, siloxane containing an epoxy group, and silsesquioxane containing an epoxy group.

5. The method for manufacturing a semiconductor device according to claim 1, wherein the component having the first insulating film has been subjected to a planarization treatment.

6. The method for manufacturing a semiconductor device according to claim 5, wherein the planarization treatment is performed by forming the first insulating film on the substrate through spin coating.

7. The method for manufacturing a semiconductor device according to claim 5, wherein the planarization treatment is performed by forming the first insulating film on the substrate and subjecting the surface of the first insulating film to chemical mechanical polishing.

8. The method for manufacturing a semiconductor device according to claim 1, wherein the layer is an ultraviolet curable resin layer interposed between the mold and the first insulating film, wherein the method further comprises the step of irradiating the resin layer with ultraviolet rays so as to cure the resin layer and form the second insulating film having the wiring trench and the first via, and wherein the step of etching the first insulating film is performed selectively.

9. The method for manufacturing a semiconductor device according to claim 1, wherein an insulating layer is provided between the first insulating film and the substrate, and wherein the step of etching the first insulating film further comprises using the second insulating film as a mask so as to form a third via, which is connected to the first via, in the first insulating film, and removing the insulating layer exposed at a bottom of the third via so as to form the second via which is larger than the first via.

10. The method for manufacturing a semiconductor device according to claim 1, wherein an etching rate of the first insulating film is more than or equal to 5 times that of the second insulating film.

11. A method for manufacturing an article having a communicating hole, comprising the steps of:
preparing a component having a first insulating film on a substrate;
disposing a layer on the first insulating film;
imprinting a mold having a pattern on the layer so as to form a second insulating film having a trench and a first via, the pattern corresponding to the trench and the first via;
etching the first insulating film by using the second insulating film as a mask so as to form a second via, which is longer than the first via and which is connected to the first via, in the first insulating film; and
filling an electrically conductive material in the wiring trench, the first via, and the second via.

12. The method for manufacturing an article according to claim 11, wherein the component having the first insulating film has been subjected to a planarization treatment.

* * * * *